United States Patent [19]
Cole, Jr. et al.

[11] Patent Number: 5,230,965

[45] Date of Patent: Jul. 27, 1993

[54] HIGH DENSITY INTERCONNECT WITH ELECTROPLATED CONDUCTORS

[75] Inventors: Herbert S. Cole, Jr., Scotia; James W. Rose, Delmar, both of N.Y.

[73] Assignee: General Electric Company, Schnectady, N.Y.

[21] Appl. No.: 895,584

[22] Filed: Jun. 8, 1992

Related U.S. Application Data

[60] Continuation of Ser. No. 690,172, Apr. 22, 1991, abandoned, which is a division of Ser. No. 459,844, Jan. 2, 1990, Pat. No. 5,127,998.

[51] Int. Cl.$^5$ .............................................. C25D 5/02
[52] U.S. Cl. ................................. 428/601; 174/261; 205/123; 205/125; 428/469; 428/472; 428/472.2; 428/610; 428/629; 428/935
[58] Field of Search ............... 205/123, 125; 428/469, 428/472, 472.2, 601, 610, 629, 935; 174/257, 261

[56] References Cited

U.S. PATENT DOCUMENTS

| | | | |
|---|---|---|---|
| 3,098,804 | 7/1963 | Wittrock | 204/41 |
| 3,505,181 | 4/1970 | Marshall | 204/27.1 |
| 3,708,403 | 1/1973 | Koger et al. | 204/27.1 |
| 3,915,811 | 10/1975 | Jremmel et al. | 204/33 |
| 4,092,448 | 5/1978 | Coll-Palagos | 204/37.1 |
| 4,236,940 | 12/1980 | Manty et al. | 204/37.1 |
| 4,443,454 | 3/1984 | Dohya et al. | 437/196 |
| 4,753,851 | 6/1988 | Roberts et al. | 428/627 |
| 4,786,523 | 11/1988 | Dohya | 427/96 |
| 4,917,963 | 4/1990 | Kittler | 428/610 |
| 4,988,412 | 1/1991 | Liu et al. | 204/15 |

OTHER PUBLICATIONS

F. A. Lowenheim, Electroplating, McGraw-Hill Book Co., New York, 1978, pp. 452-459.

*Primary Examiner*—John Niebling
*Assistant Examiner*—William T. Leader
*Attorney, Agent, or Firm*—Marvin Snyder

[57] ABSTRACT

Selective electrolytic deposition on either conductive or non-conductive bodies is provided by forming a layer of a metal which forms a plating-preventing compound on the surface of the body to be plated, and selectively interdiffusing a plating-enabling metal into the surface of that compound-forming metal in those locations where plating is desired and electroplating the body. The interdiffusion may be done before or after the plating-preventing compound has formed on the surface of the compound-forming layer. During the electroplating, the electroplating metal deposits only in those locations where the plating-enabling metal has interdiffused with the compound-forming metal. At the end of the process, the compound-forming metal may be removed in those locations where it is not covered by the electroplated metal to provide a plurality of separate plated conductors.

13 Claims, 6 Drawing Sheets

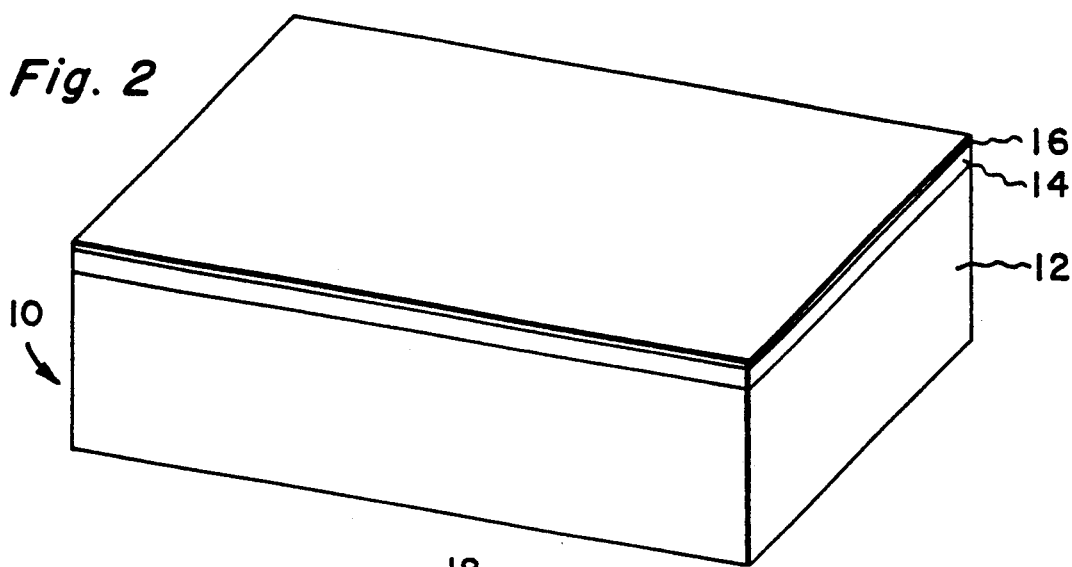
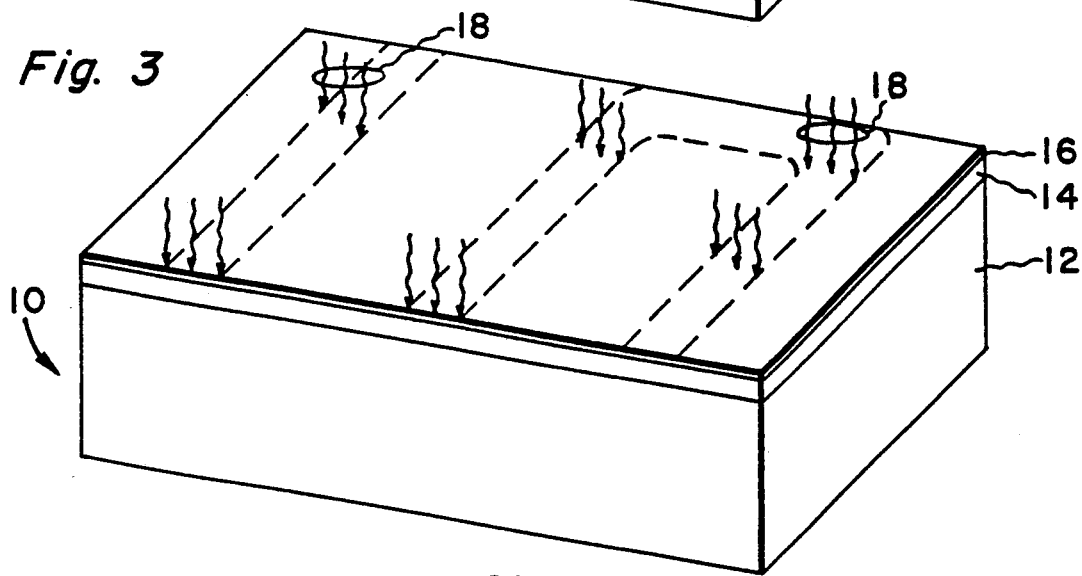
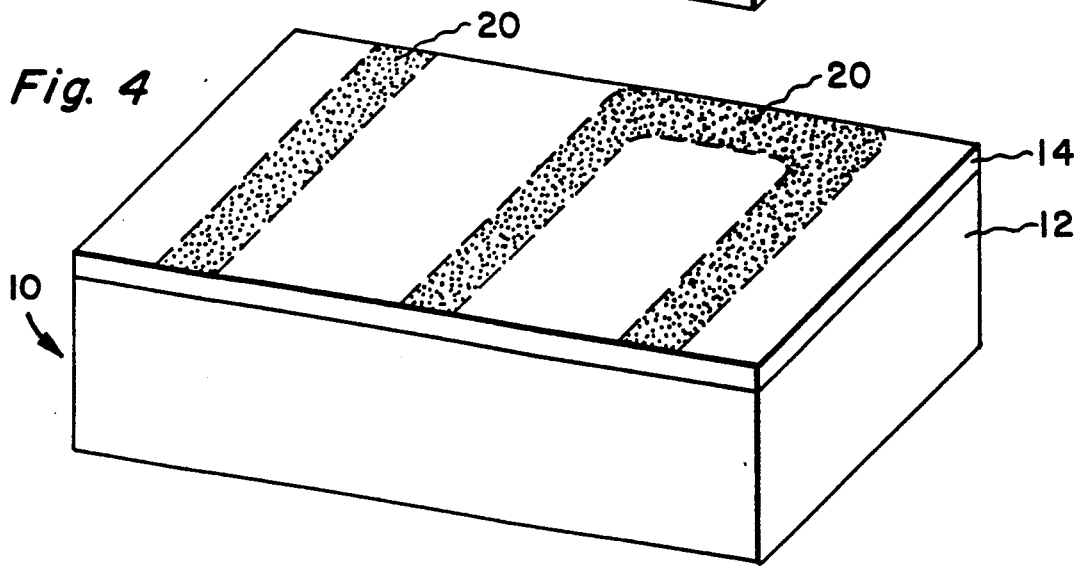

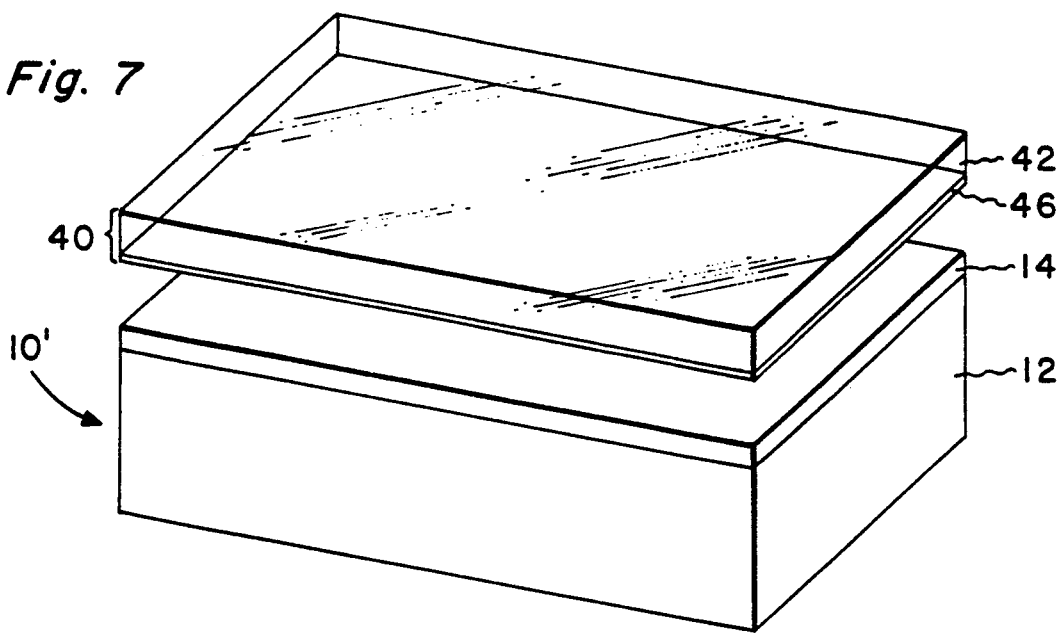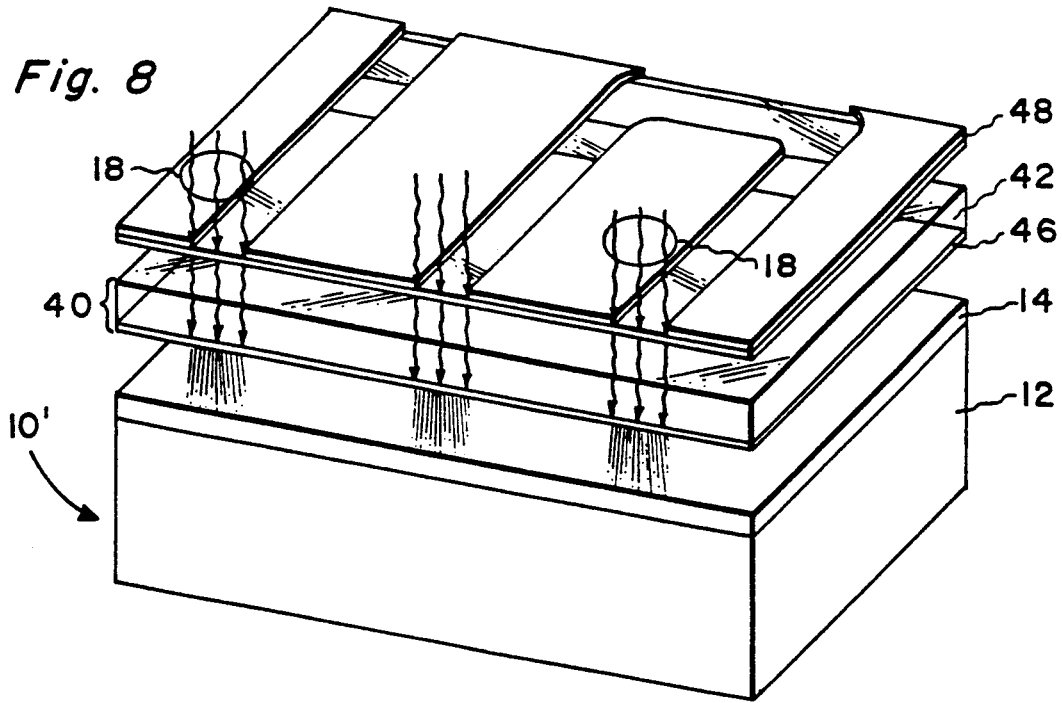

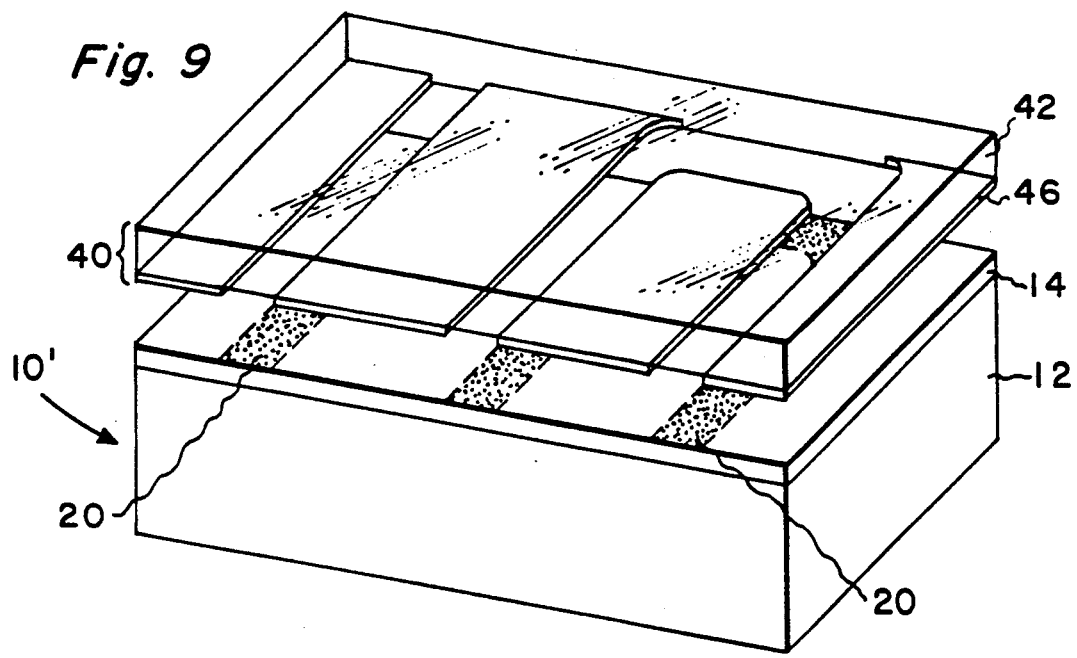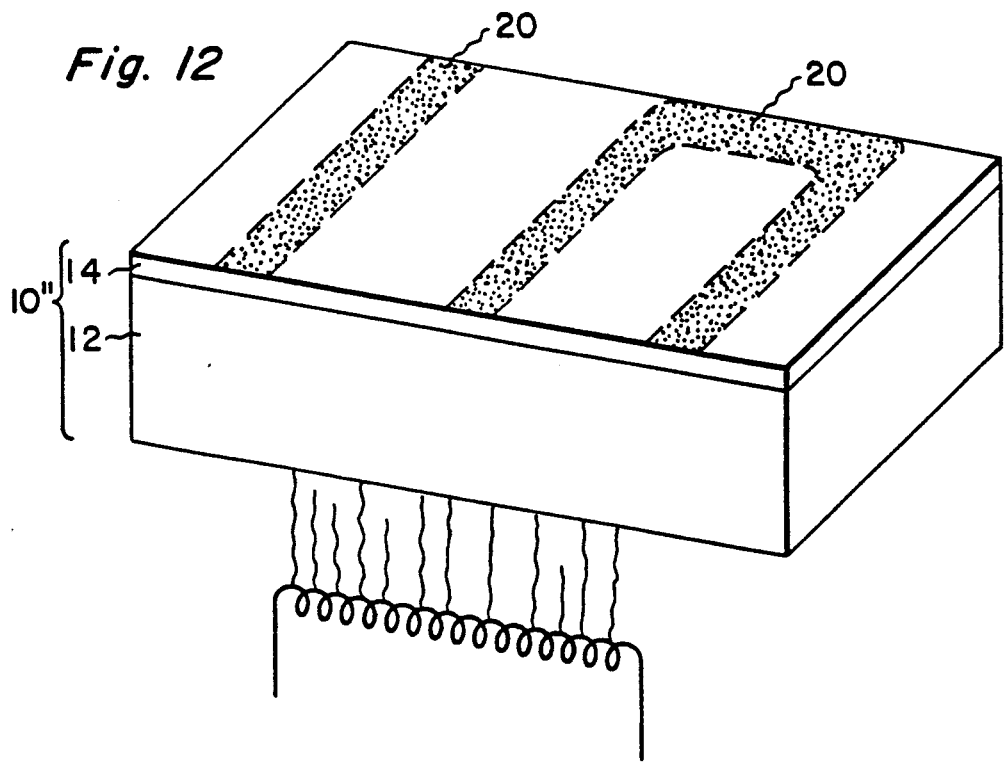

HIGH DENSITY INTERCONNECT WITH ELECTROPLATED CONDUCTORS

The government has rights in this invention pursuant to Contract No. N00014-85-C-0890 awarded by the Department of the Navy.

This application is a continuation of application Ser. No. 07/690,172, filed Apr. 22, 1991, abandoned, which is a division of application Ser. No. 07/459,844, filed Jan. 2, 1990, now U.S. Pat. No. 5,127,998.

RELATED APPLICATION

This application is related to application Ser. No. 289,944, filed Dec. 27, 1988, entitled "Selective Electrolytic Deposition on Conductive and Non-Conductive Substrates", by Y. S. Liu et al, now U.S. Pat. No. 4,988,412. The patent is incorporated herein by reference.

FIELD OF THE INVENTION

The present invention relates to the field of electroplating and microelectronic conductor formation, and more particularly, to selective formation of thick conductive patterns on microelectronic structures and other bodies.

BACKGROUND INFORMATION

A high density interconnect (HDI) structure or system which has been developed by General Electric Company offers many advantages in the compact assembly of electronic systems. This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1988, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" b C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al. (the related application cited above); U.S. patent application Ser. No. 312,536, filed Feb. 17, 1989, entitled "Method of Bonding a Thermoset Film to a Thermoplastic Material to Form a Bondable Laminate" by R. J. Wojnarowski; and U.S. patent application Ser. No. 363,646, filed Jun. 8, 1989, entitled "Integrated Circuit Packaging Configuration for Rapid Customized Design and Unique Test Capability" by C. W. Eichelberger, et al. Each of these Patents and Patent Applications is incorporated herein by reference.

Briefly, in this high density interconnect structure, the electronic chips or components of a system are disposed in a cavity or cavities of a substrate with their upper surfaces in substantially the same plane as the upper surface of the rest of the substrate. This structure is assembled by providing a thermoplastic adhesive on the bottom of the cavity. This thermoplastic adhesive layer may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the cavity. Thereafter, a polyimide film which may be Kapton ® polyimide, available from E. I. du Pont de Nemours Company, which is ~0.0005-0.003 inch (~12.5-75 microns) thick is pretreated to promote adhesion and coated on one side with the ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with contact pads on the electronic components to which it is desired to make contact. A metallization layer is deposited over the Kapton ® layer. This metallization extends into the via holes and makes electrical contact to contact pads disposed at the bottoms thereof. In order to provide high conductivity conductors with good adhesion, a layer of titanium or chromium is normally sputtered directly on top of the dielectric layer to provide good adhesion. A layer of copper is then sputtered on the adhesion layer. A relatively thick layer of copper is then electroplated on top of the sputtered copper layer to provide a thick, high conductivity conductor. That electroplated copper layer is coated with photoresist which is then laser exposed and developed to provide a mask for etching the copper. The copper is then etched to form a pattern of accurately aligned conductors at the end of the process. Additional dielectric and metallization layers are provided as required in order to provide the desired interconnection pattern. There is a need in this HDI system for a technique which will provide high quality, relatively thick patterned conductor layers in a more efficient manner.

Electrolytic metal deposition is a widely used industrial process having application to a wide variety of products and fields. In electronic applications where a specific metal pattern is required, electrolytic deposition may be used in either of two manners In the first, a uniform metal layer is formed by electrolytic deposition, the exposed surface of that layer is coated with a photoresist, the photoresist is then exposed in the desired pattern for the final metal structure, the photoresist is developed and the structure is etched to remove the unprotected electroplated material. In the second technique, a photoresist pattern is disposed on the conductive surface of a substrate structure, exposed and developed to expose the underlying conductive layer in the desired plating pattern. Thereafter, the structure is electroplated to produce a thick layer on the exposed portion of the underlying conductive layer. Where relatively thick conductive layers are desired, these processes both present problems with respect to the durability of the photoresist in the etching or plating bath because extended time periods in these solutions can cause deterioration of the photoresist. Sufficient deterioration of the photoresist results in plating or etching in undesired locations. Another technique for plating which can be used for a connected structure is to define the conductor to be plated with photoresist and remove the rest of the layer. This process depends on carrying the plating current through the structure being plated itself. This tends to result in non-uniform plating with the greater thickness being near the external electrical connections to the structure and progressively lesser thicknesses further from the connections. Thus, this is not a preferred method. An additional problem where fine line, thick metallic patterns are desired is the inability of both the plating-followed-by-photoresist-and-etching and the photoresist-followed-by-plating process to provide reliable definition of fine line structures. Another problem with the plating-followed-by-photoresist-and-etching process is the problem of accurately aligning the photoresist exposure mask with respect to the underlying structure on the substrate beneath a thick metal layer.

U.S. Pat. No. 4,988,412 discloses a technique which we call selective electrolytic deposition or SED. Selective electrolytic deposition overcomes many of the problems with prior electroplating techniques. In accordance with U.S. Pat. No. 4,988,412, a body to be plated is provided with an exterior surface which is comprised of two different conductive materials. One of these conductive materials forms a plating-preventing compound such as an oxide, while the other does not. The metal which does not form the plating-preventing compound is exposed at the surface in the desired plating pattern, while the remainder of the surface is the metal which forms the plating-preventing layer. The plating-preventing layer is allowed to form naturally in the case of some oxide plating-preventing compounds such as titanium oxide, chromium oxide and aluminum oxide, respectively on titanium, chromium and aluminum surfaces. In some cases, it is considered desirable to enhance the plating-preventing layer by high temperature oxidation. With other materials, specific processing may be necessary to create a plating-preventing layer. The metal on which the plating-preventing layer forms may be disposed on top of the metal on which plating takes place or vice versa. To perform the electroplating, the body is connected to the plating electrode, power turned on and then the body is immersed in the plating bath.

Where isolated conductors are desired the portions of the plating-preventing layer and the metal on which it forms which are not covered by the electroplated metal are removed after the electroplating by chemically selective etching as are any underlying metal layers.

While the technique disclosed and claimed in U.S. Pat. No. 4,988,412 is a great advance in the metallization art for the microelectronics industry, more convenient means of controlling the pattern of electroplating are desirable. In particular, it would be desirable to have a non-photoresist means of controlling the pattern of electroplating and it would also be desirable to avoid the necessity of providing multiple metallization layers in preparation for the electroplating.

OBJECTS OF THE INVENTION

Accordingly, a primary object of the present invention is to provide a non-photoresist technique for controlling the pattern of electroplating in selective electrolytic deposition.

Another object of the present invention is to provide selective electrolytic deposition on a body having a coating of only one metal thereon.

Still another object of the present invention is to provide electrolytic deposition on a surface of a body in accordance with a pattern of actinic illumination of that body without the use of photoresist.

A further object of the present invention is to provide an improved method of electroplating metals such as titanium, chromium and aluminum.

SUMMARY OF THE INVENTION

The above and other objects which will become apparent from the specification as a whole, including the drawings, are achieved in accordance with the present invention by providing a body having an exposed metal surface on which a plating-preventing compound or layer will form and selectively interdiffusing with that metal, a plating-enabling metal which has the effect of counteracting the plating-preventing characteristic of the exposed metal surface. The interdiffusion of the plating-enabling metal may be done either before or after the plating-preventing compound has formed on the surface of the compound-forming metal.

A number of techniques may be used to selectively interdiffuse the plating-enabling metal. A uniform coating of the plating-enabling metal may be formed on the compound-forming metal under conditions in which there is little (preferably no) interdiffusion of the two metals. Thereafter, the body is selectively treated in a manner to cause interdiffusion of the metals in those regions where electroplating is desired. This may preferably be done by scanning a laser beam in the desired plating pattern to heat the layer of plating-enabling metal to cause it to interdiffuse with the compound-forming metal. After the selective interdiffusion, the non-interdiffused plating-enabling metal is removed from the body by etching in an etchant for that metal which does not etch the compound-forming metal or which etches it only very slowly. The interdiffusion of the plating enabling metal with the compound-forming metal in the treated areas is sufficient to retain enough of the plating-enabling metal in those locations after etching to ensure that plating will take place in those locations.

In accordance with another embodiment, the plating-enabling metal may be provided in the form of an organometallic compound which may be optically, thermally, or otherwise selectively decomposed by appropriate irradiation of the surface of the body in the desired plating pattern in the presence of that organometallic compound. This process for depositing the plating-enabling metal may inherently result in the interdiffusion necessary to provide the selective plating. Alternatively, additional heating or other treatment may be performed to cause the selectively deposited plating-enabling metal to sufficiently interdiffuse with the compound-forming metal.

In accordance with another embodiment, the plating-enabling metal is coated onto a transparent substrate which is placed with the plating-enabling metal layer in contact with or directly adjacent to the body to be selectively plated. A laser beam or other appropriate source of energy is then directed through the substrate onto the plating-enabling metal layer to heat it sufficiently to cause evaporation or other transfer of that material onto the body to be plated in a pattern controlled by the pattern of the irradiation of the layer of plating-enabling metal. This transfer process itself may produce sufficient interdiffusion to provide selective electrolytic deposition. Alternatively, additional heat treatment may be used to cause further interdiffusion of the selectively deposited plating-enabling metal.

A particularly useful structure which results from this process is one in which spaced apart, conductors are located on a surface of a body. These spaced-apart conductors comprise an electroplated metal disposed on a compound-forming metal which has a plating-enabling metal interdiffused into the surface thereof.

Alternatively, the electroplated metal can be disposed on the body in a uniform manner, since the plating-enabling metal interdiffusion into the compound-forming metal enables the electroplating of the body which is otherwise not readily electroplatable.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2 illustrates the substrate of FIG. 1 after formation of a layer of a compound-forming metal and a layer of a plating-enabling metal thereon;

FIG. 3 illustrates selective heating of the plating-enabling metal to cause interdiffusion;

FIG. 4 illustrates the body after stripping of the plating-enabling metal layer;

FIG. 7 illustrates the substrate of FIG. 1 having a layer of compound-forming metal disposed on its surface ready for selective transfer of a plating-enabling metal;

FIG. 8 illustrates a selective transfer process;

FIG. 9 illustrates the structure at the end of the selective transfer process;

FIG. 12 illustrates the body of FIG. 11 being heated to induce interdiffusion of the plating-enabling metal into the surface of the compound-forming metal.

DETAILED DESCRIPTION

Figure 1:
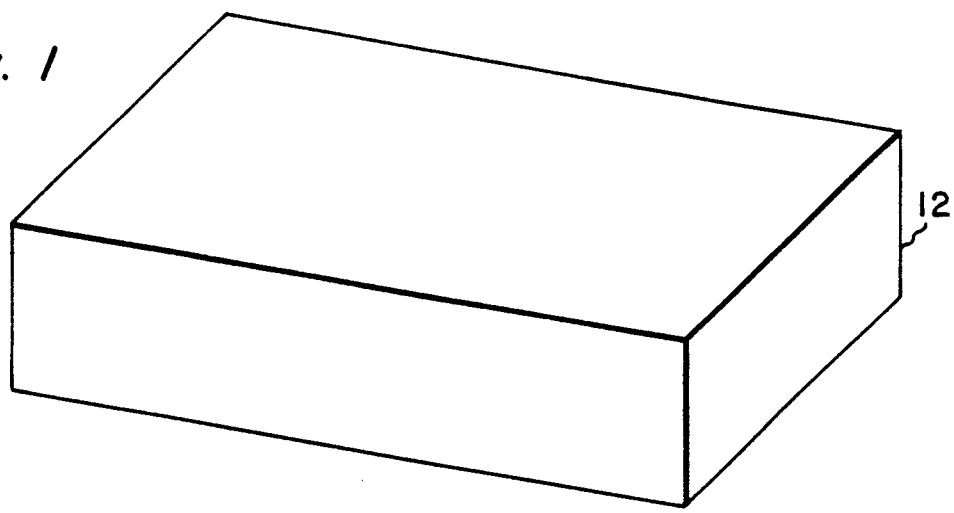
FIG. 1 illustrates a substrate on which is it desired to form an electroplated metal pattern.

FIG. 1 is a perspective illustration of a substrate 12 on which it is desired to form a patterned layer of electroplated metal. The substrate 12 may be electrically insulating or electrically conducting. It may be a uniform body or may have a complex internal structure such as that of an integrated circuit chip or a high density interconnection structure. It may have a substantially planar upper surface as shown, or it may have a surface having substantial topography. The process of this invention is effective with most surface contours.

In FIG. 2, the substrate 12 has a layer 14 of a metal which forms a plating-preventing compound (i.e. a layer of a compound-forming metal) disposed on its upper surface. The compound-forming metal 14 is a metal which forms a plating-preventing compound under appropriate circumstances as set forth in U.S. Pat. No. 4,988,412. Titanium, chromium and aluminum are examples of such metals. In each case, the commonly formed plating-preventing compound is the oxide of the metal which forms as a tight, thin, oxide, dielectric barrier which is effective for preventing electroplating of the compound coated surface of the layer. Other metals and other compounds may also be used.

In application Ser. No. 289,944, now U.S. Pat. No. 4,988,412 titanium was listed as a metal on which uniform plating occurred when gold was being plated. It should be noted here that the titanium substrate on which that uniform layer plated was a titanium layer which had had a sputtered gold layer on it which was stripped to perform the plating test. It is believed at this time that the gold layer was sputtered onto the titanium layer while the titanium layer was still hot with the result that sufficient interdiffusion occurred to make the entire surface platable in accordance with this invention. At that time the plating-enabling effect of the gold layer (due to interdiffusion into the titanium) was not recognized, thus the fact that the titanium layer used in that test had previously had a gold layer on it was not noted since the titanium layer was assumed to be in as deposited form. The significance of that previous gold layer and its effect were not discovered until long after application Ser. No. 289,944 was filed.

In FIG. 2 a thin layer 16 of a plating-enabling metal is disposed on the upper surface of the compound-forming metal 14. The plating-enabling metal 16 is one which (1) does not form a plating-preventing compound under the conditions to which the body 10 will be exposed during the overall process and (2) can be induced to sufficiently interdiffuse into the compound-forming metal that stripping the plating-enabling metal (with an etchant which is selective for the plating-enabling metal as compared to the compound-forming metal) will leave sufficient plating-enabling metal present in the compound-forming metal to enable electroplating of the surface of the interdiffused portion of the compound-forming metal. That is, the interdiffused plating-enabling metal defeats the plating-preventing effect of the plating-preventing compound which forms on the surface of the compound-forming metal. A preferred plating-enabling metal is gold. The plating-enabling metal layer 16 must be deposited in a manner which avoids inducing any significant interdiffusion of the metal 16 into the surface of the metal 14 for reasons discussed briefly above. The substrate 12 in combination with the layers 14 and 16 comprise a body 10 which is to be selectively electroplated.

In FIG. 3, the body 10 is shown being exposed to actinic radiation 18 in a patterned manner in which the actinic radiation 18 strikes the layer 16 only in those locations which are in alignment with portions of the substrate 12 where electroplating is desired. This actinic radiation 18 may be a laser beam, thermal energy, a particle beam or any other radiation which is effective for the purpose. The purpose of this exposure is to cause interdiffusion of the plating-enabling metal 16 into the surface of the compound-forming metal in those locations (and only those locations) which are irradiated with the actinic radiation 18.

Next, the plating-enabling metal layer 16 is stripped from the body 10 with an etchant which is selective for the plating-enabling metal as opposed to the compound-forming metal. Where the plating-enabling metal 16 is gold, it is stripped from the body by immersion in aqua regia (a mixture of nitric and hydrochloric acids) to dissolve the non-interdiffused gold everywhere. At the end of this etching or stripping step, the compound-forming metal 14 has a surface which differs in those areas which were irradiated and those areas which were not. This is shown schematically in FIG. 4 by the stippling within the dashed outlines of the regions 20 which were irradiated to cause interdiffusion. In the untreated regions the exposed surface of the compound-forming metal 14 is substantially pure and has a continuous, pinhole-free oxide coating on it once the body has been exposed to air. In the treated regions 20, the plating-enabling metal is interdiffused with the compound-forming metal in a manner which either (1) prevents the formation of the plating-preventing compound or (2) provides a high enough density of pinholes in the surface layer of the plating-preventing compound that good plating contact results and a substantially uniform electroplated layer is formed during the electroplating step. The latter possibility is thought to be what actually occurs.

Figure 5:
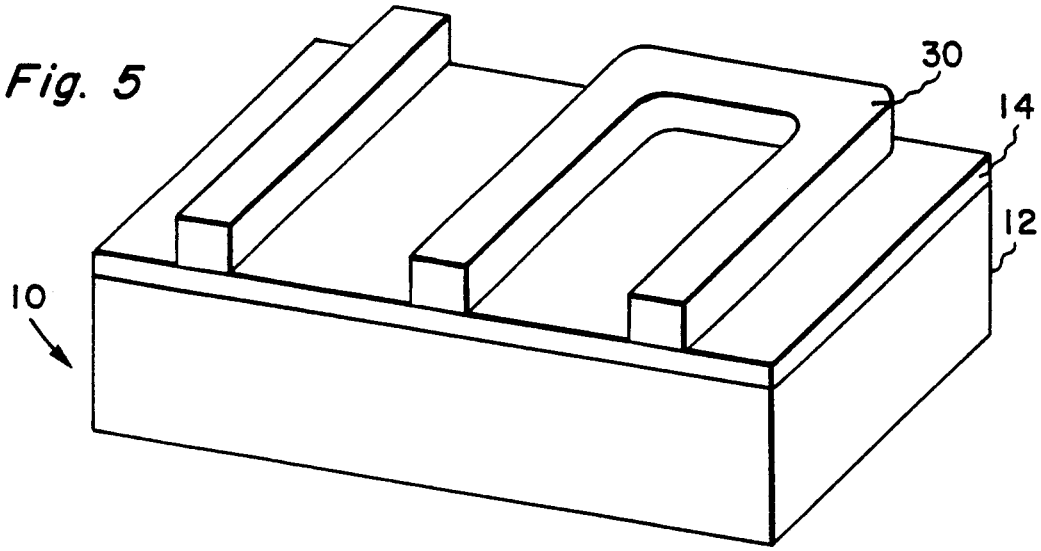
FIG. 5 illustrates the body after plating.

Sufficient plating-enabling metal is present in the regions 20 that when the body 10 is connected to the cathode of a copper plating bath, the power turned on and the body immersed in the plating bath, copper electroplates uniformly on the treated regions 20 of the compound-forming metal and not at all on the untreated regions. This electroplating is successful even when the body 10 is 2 inches by 2 inches or larger and the only continuous conducting layer in the body 10 through which the plating current can flow is a layer of titanium which is only about 1000 Å thick. When the desired thickness of the plated metal has been deposited on the body 10, the body is removed from the plating bath and appears generally as illustrated in FIG. 5. Thereafter, where isolated conductors 30 are desired, those portions of the compound-forming metal 14 which are not covered by the electroplated metal are removed by selective chemical etching to produce the structure shown in FIG. 6. Where the compound-forming metal is titanium, this etching may be done with hydrofluoric acid.

The quality of the electroplated conductor or line is a function of the degree of laser focus and the quality of the electroplating bath. Using this process, we have plated conductors as narrow as 25 microns wide to a thickness of as much as 4 microns with only slight mushrooming of the plated line as it thickens.

The body 10, as shown in FIG. 2, may be formed in a variety of ways. The substrate 12 may be inserted in sputtering apparatus and the layer 14 of the compound-forming metal may be sputtered thereon. The substrate 12 and the layer 14 should be cooled prior to and preferably during sputtering of the plating-enabling metal onto the surface of the compound-forming metal in order to ensure that undesired interdiffusion does not take place during the deposition process. Unless such precautions are taken, excessive interdiffusion may occur with the result that uniform plating takes place on the compound-forming metal after stripping of the plating-enabling metal, independent of the selective nature of the patterning interdiffusion step which will be discussed subsequently. The plating-enabling metal may be deposited on the compound-forming metal during the same vacuum cycle in which the compound-forming metal was deposited. When that is done, the plating-preventing compound is not present at the interface between the plating-enabling metal 16 and the compound-forming metal 14. Alternatively, the vacuum in the sputtering system may be broken and air may be admitted to the sputtering system following the deposition of the compound-forming metal. The vacuum may thereafter be re-established and the plating-enabling metal sputtered onto the now plating-preventing-compound-coated surface of the compound-forming metal 14. Such subsequent deposition may be done in the same sputtering chamber or in a separate sputtering chamber or by other processes.

Independent of the manner in which the body 10 of FIG. 2 is formed, the interdiffusion process renders the interdiffused portions 20 of the surface of the compound-forming metal 14 electroplatable. Thus, when the oxide or other plating-preventing compound is present at the interface between the metals 14 and 16, the interdiffusion process causes sufficient interdiffusion of the plating-enabling metal through that oxide layer into electrical contact with the underlying compound-forming metal 14 to provide good electroplating contact. More is not required in order to provide selective electrolytic deposition. Our work has not shown any difference between (1) test samples in which no oxide was allowed to form prior to the deposition and interdiffusion of gold and (2) test samples where the gold was deposited after formation of an oxide layer on the titanium. Thus, the gold interdiffusion apparently locally destroys the titanium oxide on at least a microscopic scale, or penetrates the titanium oxide layer in a manner which displaces the oxygen of the titanium oxide in a manner which leaves the gold exposed for electrical contact to the plating bath. However, characteristics of the final body as far as contact resistance between the plated metal and an underlying metal (layer 14) may be affected by such things as the presence of that oxide compound at the interface prior to interdiffusion and the atomic percent in which the plating-enabling metal is present in that surface layer.

The layer 14 of compound-forming metal which is disposed on the surface of the substrate 12 is the component of the body 10 which interacts in the electroplating process. Thus, the details of the internal configuration of the substrate 12 are unimportant to the selective electrolytic deposition aspects of the present invention. Clearly, in the electronic arts, the actual structure of the substrate 12 is quite important, especially if the purpose of the electroplated conductor portions 30 is to provide electrical connections between different portions of the substrate 12, since in that situation, the conductor portions 30 must be properly aligned with respect to the underlying substrate 12 in order to serve their intended purpose.

We had Rutherford Backscattering (RBS) and Auger analysis performed on the surface of the compound-forming metal after stripping of the gold plating-enabling metal. This RBS analysis showed a gold concentration of 1 atomic percent in titanium provides good enough electroplating contact that uniform plating occurs when the titanium layer is immersed in a copper electroplating bath in the manner discussed below. This 1% gold concentration is below the detection limit with Auger analysis. These analyses show that oxygen is also present in the treated portion of the surface. Since a gold concentration as low as 1% enables electroplating and surface analysis shows oxygen is present, it is believed that titanium oxide is still present in the treated regions when the gold concentration is as low as 1%, but that the gold causes or creates a high density of conducting apertures in the oxide thereby providing the electrical contact necessary for electroplating. Greater concentrations of gold are also effective, as lesser concentrations may be. We have not determined a lower limit on the gold concentration which successfully counteracts the plating-preventing characteristic of the metal 14.

We use the term "interdiffusion" as a general term to describe the process of treating the surface of the compound-forming metal 14. Other terms which may be used include alloying, diffusion and surface modification. The significant feature being the presence of sufficient gold or other plating-enabling metal in the surface of the compound-forming metal to enable electroplating of that surface. Our RBS analysis of the gold interdiffused surface of a titanium layer indicates that in the case of gold and titanium, the gold may be present at 1 atomic percent to a depth of as much as 200 Å. Thus, these two metals are interdiffused such that prior to stripping the gold, there is not a crisp interface at which one could say there is gold only above this point and titanium only below this point. Further, the gold etchant aqua regia is incapable of removing that interdiffused gold from the titanium surface. This leads to the selective electrolytic deposition which takes place in this process.

The process which has just been described involves the deposition of a uniform layer of the plating-enabling metal across the surface of the compound-forming metal, at least in those areas where it is desired to be able to electroplate the body. Obviously, on a body with a large surface, it is only necessary to deposit the plating-enabling metal in the vicinity of regions where plating is desired. As an alternative to such uniform deposition of plating-enabling metal, that plating-enabling metal may be deposited in the precise pattern in which plating is desired and either interdiffused into the compound-forming metal as part of that deposition process, or subsequently, by substantially uniform treatment of the body. Under these circumstances, the patterned nature of the layer of plating-enabling metal controls the locations in which the interdiffusion takes place. Alternatively, where interdiffusion does not take place as part of the deposition process, a combination of selective deposition and selective interdiffusion may be used to provide interdiffusion only in those locations where the plating-enabling metal was deposited *and* interdiffused.

One technique for selectively depositing the plating-enabling metal is illustrated in connection with FIGS. 7-9. In FIG. 7, a body 10' to be plated comprises a substrate 12 having a uniform layer of a compound-forming metal 14 disposed on the upper surface thereof. Disposed immediately adjacent thereto and preferably in contact therewith, is a plate, a slide or a film 40 comprising a substrate 42 having a uniform layer 46 of the plating-enabling metal disposed thereon. The slide 40 is positioned with the plating-enabling metal 46 in direct contact with, or directly adjacent to, the compound-forming metal 14. In FIG. 7, the slide 40 is illustrated slightly displaced from the body 10' in order that the dividing line between the body 10' and the slide 40 will be clear.

In FIG. 8, the process of selectively depositing the plating-enabling metal 46 onto the body 10' is illustrated. In particular, actinic radiation 18 is directed through the transparent substrate 42 onto the layer 46 of plating-enabling metal. The actinic radiation is sufficiently intense that the plating-enabling metal 46 is evaporated off the slide 40 and deposited on the upper surface of the compound-forming metal 14 in those locations where the actinic radiation reaches the plating-enabling metal layer. The plating-enabling metal may deposit on or may directly interdiffuse into the compound-forming metal 14 to form a selective pattern of the plating-enabling metal 46 on/in the compound-forming metal 14. This is a transfer deposition process, in that the plating-enabling metal is selectively transferred from the slide onto the body to be electroplated.

The patterning of the actinic radiation 18 may be controlled by a mask 48 as illustrated. Alternatively, a laser or other light beam may be scanned across the plate 40 in the desired pattern of the deposition of the plating-enabling metal. We have successfully performed this process using a substrate 42 of LEXAN ® polycarbonate film (available from the General Electric Company) having a layer 46 of gold 200 Å thick disposed thereon. We used a cw Argon-ion (351 nm) laser which was scanned across the film 40 (without a mask) in the desired deposition pattern at a rate of 1.5 mm/sec with a spot size of about 6 microns. Although we used both higher and lower powers successfully, we got our best results with a laser power of between 0.4 and 1.2 watts, which corresponds to a power of from 0.1 to 0.3 watts at the slide. Thus, this process can be carried out in a rapid, efficient manner for drawing the desired conductors of an HDI structure.

LEXAN® or another flexible film is a desirable material for use as the transfer substrate because it is flexible and can be wrapped around a curved body or can be held tightly against any body by evacuating the toward-the-body side of the structure to cause air pressure on the away-from-the-body side of the film to cause intimate contact between the gold film and the body for improved resolution in the transfer process.

In FIG. 9, the structure of FIGS. 7 and 8 is illustrated following the transfer process in which the plating enabling layer 46 on the LEXAN® film was ablated off the film in those locations where it was exposed to actinic radiation and formed interdiffused regions 20 on the surface of the compound-forming metal 14 in alignment therewith. This body was then electroplated and appeared as shown in FIG. 5. The electroplated metal 30 deposited only in those locations which had been sensitized or prepared by the plating enabling transfer process. The compound forming metal 14 can be removed from this structure in a manner similar to that in the process already described to yield a structure like that in FIG. 6.

In our experience with this transfer process, no separate heat treatment was required to interdiffuse the gold plating-enabling metal into the surface of the titanium compound-forming metal. However, if a transfer process was used which did not create sufficient interdiffusion, the body 10' could be heated to a sufficient temperature to cause interdiffusion. This would result in selective interdiffusion in those locations where the gold or other plating-enabling metal was present without causing interdiffusion elsewhere. Thus, the process illustrated in FIGS. 7–9 is one in which the deposition of the plating-enabling metal is selective, but the interdiffusion step may be non-selective in its treatment of the body 10'. This contrasts with the process illustrated in FIGS. 2–4 in which the deposition of the plating-enabling metal is uniform and the interdiffusion process is location selective. In the process of FIGS. 7–9, interdiffusion of the gold into the titanium is not necessary so long as plating enabling conductivity is established. That is, since no gold etching is done prior to the electroplating, it is not necessary for the gold which enables the plating to be secure in the face of a gold etching process. However, in most situations the establishment of the conductivity in the presence of the plating-preventing compound will involve interdiffusion of the gold into the titanium or other compound-forming metal.

Figure 10:
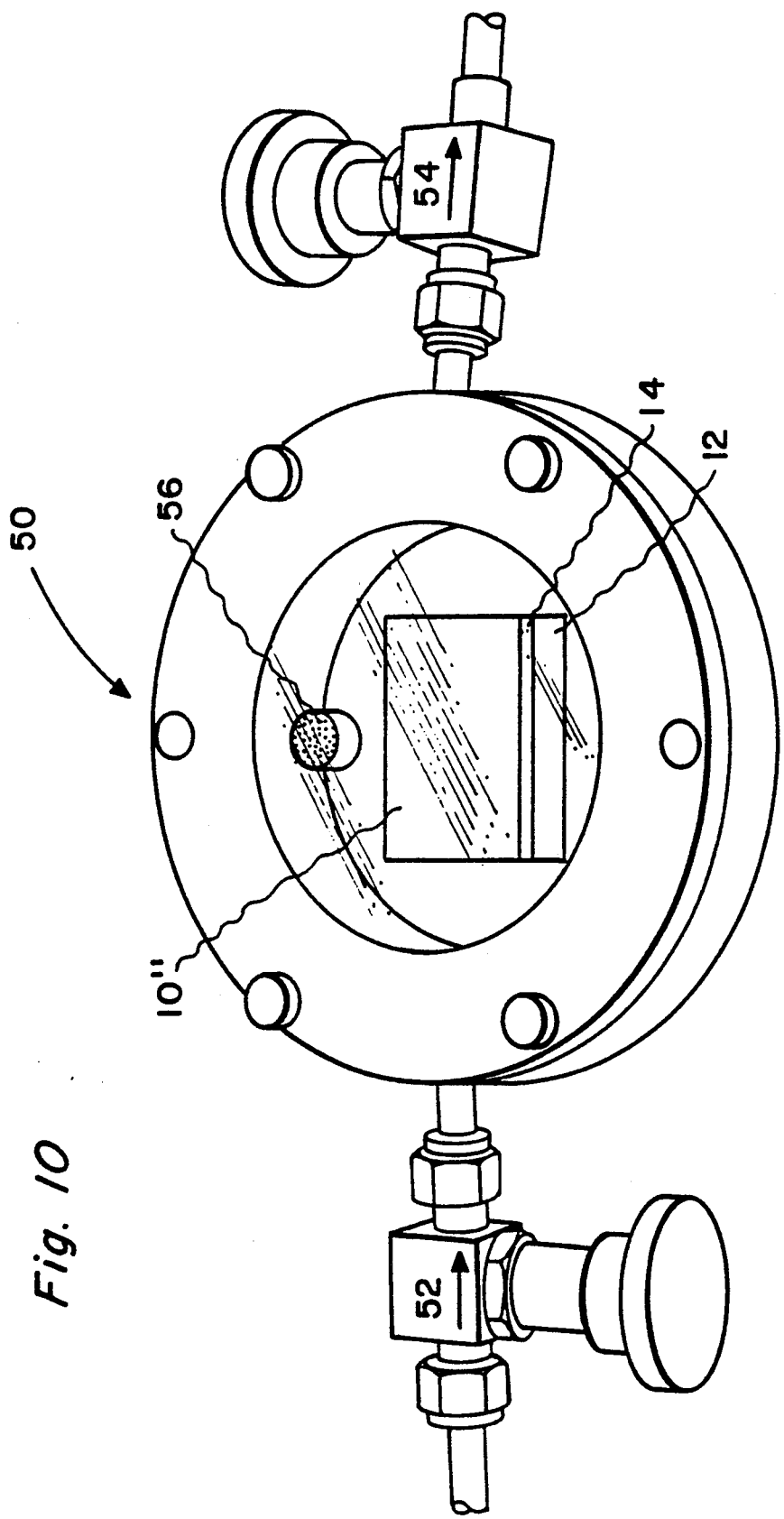
FIG. 10 illustrates the body of FIG. 7 disposed in a controlled atmosphere environment in preparation for gaseous deposition of a plating-enabling metal.
Figure 11:
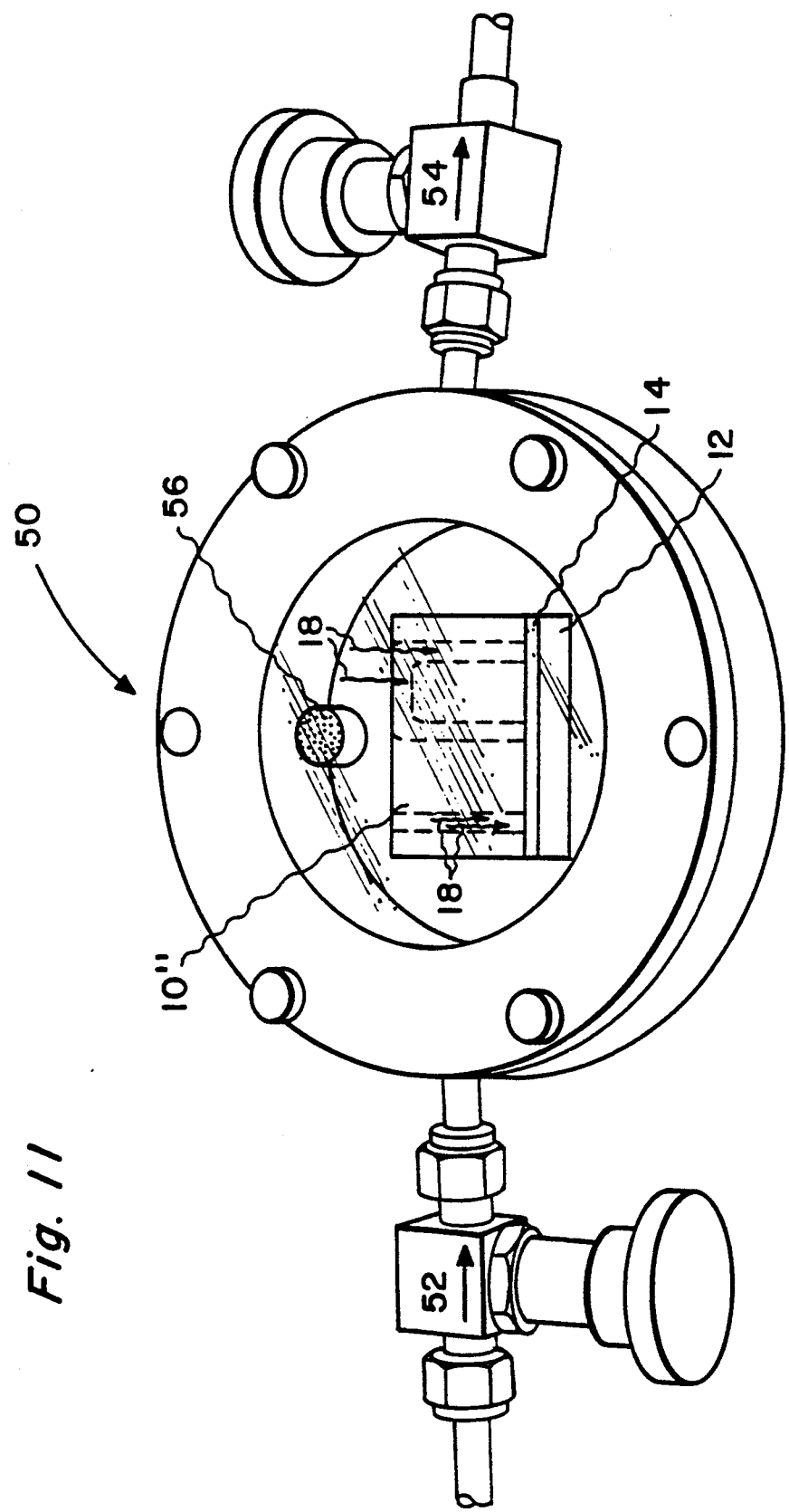
FIG. 11 illustrates a plating-enabling metal being deposited by decomposition of an organometallic compound.

In FIGS. 10–12, an alternative selective deposition process is illustrated. In FIG. 10, a body 10" comprises a substrate 12 having a compound-forming metal layer 14 on the surface thereof, is disposed in a reaction chamber 50 ready for the deposition of the plating-enabling metal from a gaseous source material. The chamber 50 is formed of stainless steel and has a quartz window. The atmosphere in the chamber 50 is controlled by inlet and outlet valves 52 and 54, respectively, and the gas supply and vacuum conditions which are applied thereto. A solid source 56 of the gaseous source material is disposed in the chamber 50. A sufficient vapor pressure of the source material may be established by heating the entire chamber, or just the source material itself, as may be appropriate under the circumstances when the source material vapor pressure is not sufficient under ambient temperature conditions.

In FIG. 11, a laser beam or other energy source 18 is directed at the body 10" in the presence of an appropriate concentration of an organometallic compound of the desired plating-enabling metal in order to deposit the plating-enabling metal in the desired pattern on the body 10". Where the plating-enabling metal is gold, suitable organometallic compounds include dimethyl gold-hexafluoroacetylacetonate, dimethyl gold-trifluoroacetylacetonate and dimethyl gold-acetylacetonate. Other source compounds may also be used. We prefer the dimethyl hexafluoro compound because of its relatively high vapor pressure. During the decomposition reaction, this source material also releases fluorine which may attack the titanium oxide plating-preventing compound. These organometallic compounds decompose either thermally or by photoactivation. In either case, focusing a laser beam on the surface of the compound-forming metal 14 on which deposition is desired, results in the deposition of the plating-enabling metal in those locations. Two different mechanisms can contribute to this deposition. In the first, the laser heats the surface with the result that molecules of the organometallic compound coming in contact with that portion of the surface are decomposed and leave their metal ions behind on the surface. In the other mechanism, the laser light photodecomposes the organometallic compound with the result that the metal ions deposit on the substrate directly adjacent to the location in which the decomposition takes place.

Figure 6:
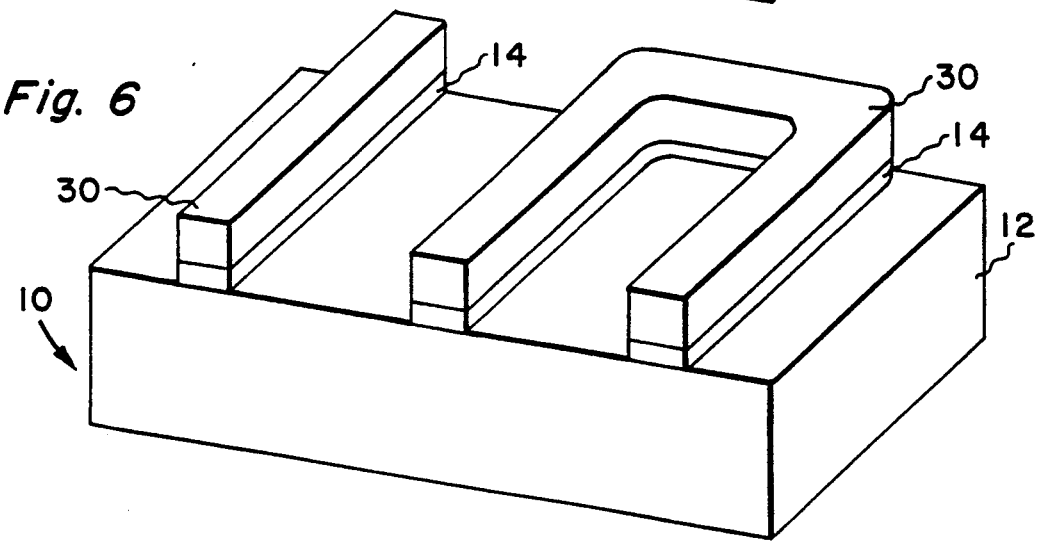
FIG. 6 illustrates the body after removal of the layer of compound-forming metal.

If further interdiffusion of the plating-enabling metal into the plating-preventing compound and the compound-forming metal 14 is desired, the entire body 10" may be heated as shown schematically in FIG. 12. This heating may be done in an oven or the body may be treated in another uniform manner to cause further interdiffusion of the plating-enabling metal in those locations where it has already been selectively deposited. Alternatively, the interdiffusion can be done selectively to cause interdiffusion only in those locations where the plating-enabling metal was deposited *and* which are also selectively treated to cause interdiffusion. Following that interdiffusion step, the body 10" is readied for electroplating to produce the structure illustrated in FIG. 5. The background, compound-forming metal may be selectively removed to leave individual electrolytically deposited photoconductors 30 disposed on the substrate 12 as shown in FIG. 6.

In our experience, the energy delivered to the substrate in the process of thermally or optically decomposing the organometallic compounds produces sufficient interdiffusion of the plating-enabling metal into the compound-forming metal through the plating-preventing compound to produce the desired selective electrolytic deposition upon electroplating.

While as little as 1 atomic percent gold in titanium is sufficient to produce good electroplating contact, substantially more gold, and even a layer of gold, may be used where a selective deposition process produces such a layer. In that situation, the significant characteristic is that the gold sufficiently interdiffuses with the titanium to provide good electroplating contact. Gold which is merely cold deposited on top of a titanium oxide layer on titanium does not provide such plating contact to the titanium. Consequently, interdiffusion is necessary in order to sufficiently penetrate the oxide layer to produce the electroplating enabling characteristic, however, interdiffusion may inherently occur as part of the selective deposition process as it did in both of the above examples.

While each of the specific examples to this point has used gold as the plating-enabling metal, it will be understood that many other metals are potentially suitable, including platinum, palladium, silver and so forth. These metals may be provided as organometallic compounds for metallic deposition. What is required when the plating-enabling metal is deposited on the compound-forming metal without breaking vacuum in a sputtering or other process is that the plating-enabling metal is subsequently sufficiently interdiffused with the compound-forming metal that removal of the bulk of the plating-enabling metal layer in a particular etching or other removal process leaves a sufficient quantity of the plating-enabling metal present only on those portions of the surface which have been "interdiffused" to provide good electroplating contact in those regions while the plating-preventing compound forms on the remainder of the surface of the compound-forming metal. When the plating-preventing compound is already present before deposition of the plating-enabling metal, what is required is sufficient interdiffusion of the plating-enabling metal into the compound-forming metal to provide good electroplating contact.

We used gas phase deposition to deposit and interdiffuse palladium in a 1000 Å chromium layer disposed on a KAPTON® film which was laminated on a glass slide. The source compound was palladium hexafluoroacetylacetonate. Selective deposition was achieved using a 351 nm laser. The slide was connected for plating and immersed in the copper plating bath without further treatment after the completion of the selective palladium deposition process. Copper plated only in those locations where the palladium had been selectively deposited and plated uniformly there. Thus, this confirms that metals which do not form plating-preventing compounds and which will interdiffuse into the compound-forming metal provide selective electrolytic deposition. Where selective deposition of the plating-enabling metal is used, the plating-enabling metal does not have to interdiffuse into the compound-forming metal provided that it does sufficiently penetrate the plating-preventing compound to provide good electroplating contact.

Each of these processes produces a structure which is unique to this invention. That is, an electroplated conductor which is disposed on what may be characterized as an adhesion promoting metal (which may be the compound-forming metal) in which a plating enabling or noble-like metal is present in the surface portion of that compound-forming metal in sufficient concentration to provide electroplating contact. Structures which may appear similar which are made by a different process will not contain that typically small percentage of the plating-enabling metal interdiffused in only the surface portion of the compound-forming metal. Consequently, not only is this process beneficial because it eliminates the need for photoresist, provides the ability to accurately and rapidly laser draw a metallization pattern on the surface of the body, but it also produces a structure which is unique both because of the detail in which it can be electroplated and the because of the simplicity with which it can be formed with a resulting minimization of the cost of that step in the manufacturing process. While specific selective deposition techniques for the plating-enabling metal have been discussed, it will be understood that any selective deposition process can be used in accordance with the present invention in order to provide the plating-enabling structure in the desired pattern. Similarly, although specific interdiffusion techniques have been discussed, many others may be used in accordance with the invention.

While the discussion of this invention has been in terms of selective interdiffusion of the plating-enabling metal into the compound-forming metal, it should be recognized that a uniform interdiffused layer could be formed and then selectively patterned to produce the same ready-to-plate structure. That procedure is not preferred at this time because the selective interdiffusion process is substantially more efficient than a selective removal process.

The discussion thus far has focused on selective electroplating of the surface of a body because of the importance of that capability in the microelectronics arts. However, the present invention has much wider applicability in that it provides a means of electroplating metals which form plating-preventing compounds when exposed to air. Thus, the entire body to be plated can be a compound-forming metal such that the layer 14 is a part of the substrate, rather than a separately formed layer. Titanium, chromium and aluminum are important, common metals which form such plating-preventing compounds which are oxides. Diffusing a plating-enabling metal into the surface of such compound-forming metals provides a means of ensuring high quality, uniform electroplating on such metals while eliminating the need for the use of hot, aggressive descaling baths in an attempt to remove surface oxides in a manner which ensures good plating. Such aggressive baths are a particular problem when it is desired to plate one of these compound-forming metals which is part of a larger body having portions which would be damaged by the use of normal descaling baths.

Whether a particular metal is effective as the plating-enabling metal can be easily determined by depositing the potential plating-enabling metal on a substrate having the compound-forming metal as its surface, annealing or otherwise treating the body to ensure that interdiffusion has taken place, stripping the potential plating-enabling metal from the body and electroplating the body. If the electroplating is successful, then the metal being tested is effective as the plating-enabling metal. If no plating takes place, then it is not effective as the plating-enabling metal. Where the metal would be deposited by gas decomposition, such that interdiffusion may not be necessary the metal can be deposited on the test body and the electroplating undertaken to determine its suitability as the plating-enabling metal While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic circuit comprising: a first layer of metal having a surface, with an electroplating-preventing compound of the metal formed on said surface in an amount sufficient to prevent electroplating;
   at least a portion of said surface being an interdiffused portion having an electroplating-enabling metal interdiffused on a selected region to define a pattern, and capable of being electroplated; and
   an electroplated metal conductor deposited by electroplating directly on said interdiffused portion of said first layer.

2. The circuit recited in claim 1 wherein:
said circuit includes a high density interconnect structure which interconnects a plurality of integrated circuit, said high density interconnect structure including said electroplated metal conductor.

3. The circuit recited in claim 1, wherein said compound-forming metal comprises titanium.

4. The circuit recited in claim 3, wherein said electroplating-enabling metal comprises gold.

5. The circuit recited in claim 1, wherein said electroplating-enabling metal comprises gold.

6. The circuit recited in claim 1, wherein said compound-forming metal is selected from the group consisting of titanium, chromium and aluminum.

7. The circuit recited in claim 6, wherein said electroplating-enabling metal is selected from the group consisting of gold, platinum, palladium and silver.

8. The circuit recited in claim 1, wherein said electroplating-enabling metal is selected from the group consisting of gold, platinum, palladium and silver.

9. In combination:
a first layer of metal having a surface, with an electroplating-preventing compound of the metal formed on said surface in an amount sufficient to prevent electroplating;
at least a portion of said surface being an interdiffused portion having an electroplating-enabling metal interdiffused on a selected region to define a pattern, and capable of being electroplated; and
a second layer of metal deposited by electroplating directly on said interdiffused portion of said first layer.

10. The combination recited in claim 9, wherein said compound-forming metal is selected from the group consisting of titanium, chromium and aluminum.

11. The combination recited in claim 10, wherein said electroplating-enabling metal is selected from the group consisting of gold, platinum, palladium and silver.

12. The combination recited in claim 9, wherein said electroplating-enabling metal is selected from the group consisting of gold, platinum, palladium and silver.

13. An electronic circuit comprising:
a layer of a first metal selected from the group consisting of titanium, chromium and aluminum, with an electroplating-preventing oxide of the metal formed on a surface of said layer in an amount sufficient to prevent electroplating;
at least a portion of said surface being an interdiffused portion having a second metal selected from the group consisting of gold, platinum, palladium and silver interdiffused on a selected region to define a pattern, and capable of being electroplated; and
an electroplated metal conductor deposited by electroplating directly on said interdiffused portion of said surface.

* * * * *